United States Patent
Marsh et al.

(10) Patent No.: US 7,317,234 B2
(45) Date of Patent: Jan. 8, 2008

(54) MEANS OF INTEGRATING A MICROPHONE IN A STANDARD INTEGRATED CIRCUIT PROCESS

(76) Inventors: Douglas G Marsh, 1031 Graham St., Bethlehem, PA (US) 18015-2520; Apparajan Ganesan, Wallace Unit, 1675 FM 3525, Colorado City, TX (US) 79512

( * ) Notice: Subject to any disclaimer, the term of this patent is extended or adjusted under 35 U.S.C. 154(b) by 134 days.

(21) Appl. No.: 11/184,220

(22) Filed: Jul. 20, 2005

(65) Prior Publication Data

US 2007/0018318 A1 Jan. 25, 2007

(51) Int. Cl.
*H01L 29/84* (2006.01)

(52) U.S. Cl. ............... 257/416; 257/737; 257/E31.052; 381/175; 381/174; 381/191

(58) Field of Classification Search ................. 257/416
See application file for complete search history.

(56) References Cited

U.S. PATENT DOCUMENTS

| | | | |
|---|---|---|---|
| 4,533,795 A | 8/1985 | Baumhauer, Jr. et al. ... 179/111 |
| 4,610,062 A * | 9/1986 | Roberts et al. ............ 29/25.41 |
| 4,922,471 A | 5/1990 | Kuehnel ....................... 367/181 |
| 5,740,258 A | 4/1998 | Goodwin-Johansson ..... 381/72 |
| 5,881,159 A | 3/1999 | Aceti et al. ................... 381/328 |
| 6,001,666 A | 12/1999 | Diem et al. .................... 438/52 |
| 6,156,585 A | 12/2000 | Gogoi et al. ................... 438/48 |
| 6,249,075 B1 | 6/2001 | Bishop et al. .............. 310/338 |
| 6,283,915 B1 | 9/2001 | Aceti et al. .................. 600/300 |
| 6,324,907 B1 | 12/2001 | Halteren et al. .............. 73/431 |
| 6,343,514 B1 | 2/2002 | Smith ........................... 73/719 |
| 6,426,239 B1 | 7/2002 | Gogoi et al. ................... 438/53 |
| 6,473,511 B1 | 10/2002 | Aceti et al. ................... 381/322 |
| 6,615,667 B2 | 9/2003 | Smith ........................... 73/719 |
| 6,667,189 B1 | 12/2003 | Wang et al. .................... 438/53 |
| 7,146,016 B2 * | 12/2006 | Pedersen ..................... 381/175 |

* cited by examiner

*Primary Examiner*—Tu-Tu Ho

(57) ABSTRACT

A means of integrating a microphone on the same integrated circuit die as other electronics in the system is disclosed. The structure uses solder bump technology to form a gap between an electrode on the silicon and another electrode. Charge is stored on the capacitor so when pressure from sound waves causes one electrode to flex, the capacitance and therefore the charge changes, causing signal current. The structure allows for area efficiency by allowing placement of active silicon circuitry under the microphone.

6 Claims, 10 Drawing Sheets

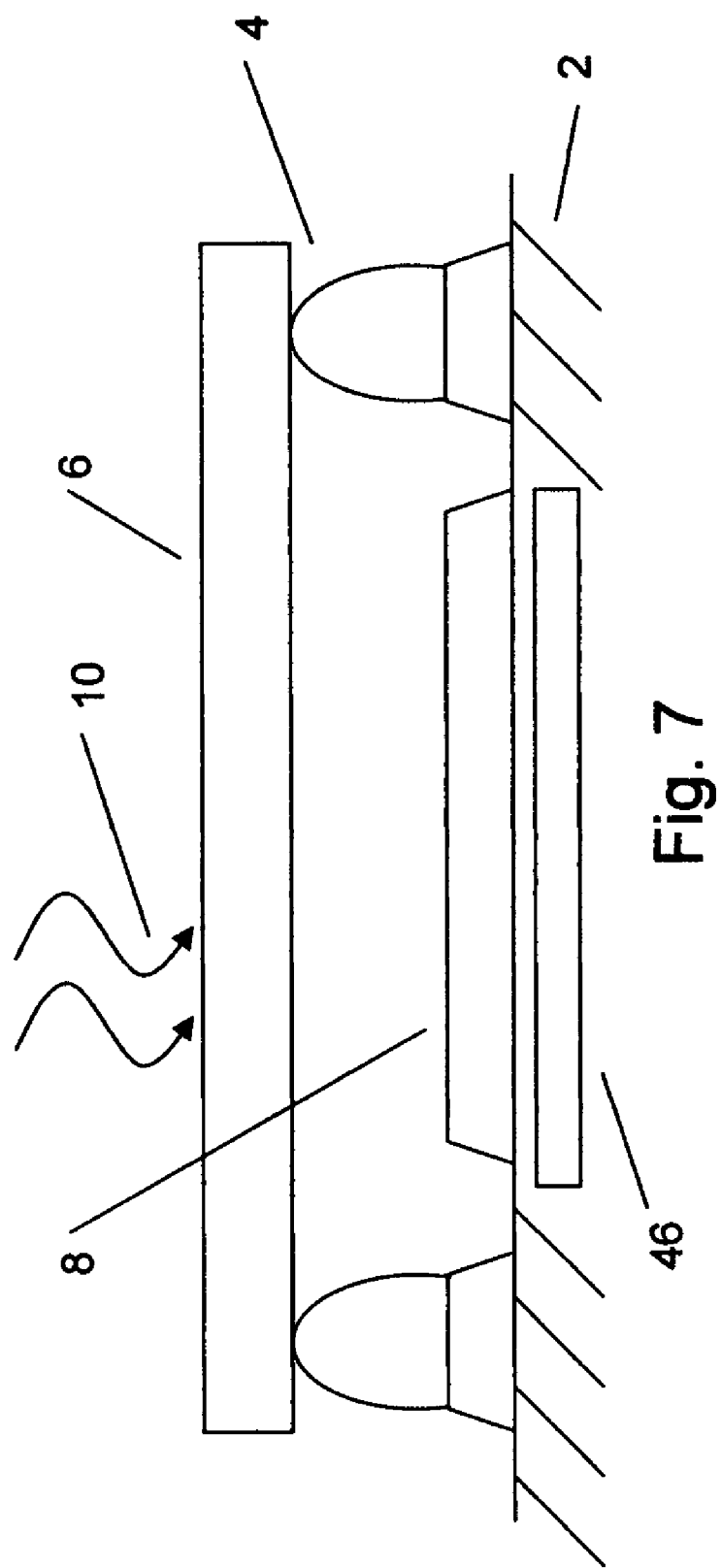

MEANS OF INTEGRATING A MICROPHONE IN A STANDARD INTEGRATED CIRCUIT PROCESS

CROSS-REFERENCE TO RELATED APPLICATIONS

Figure 1:
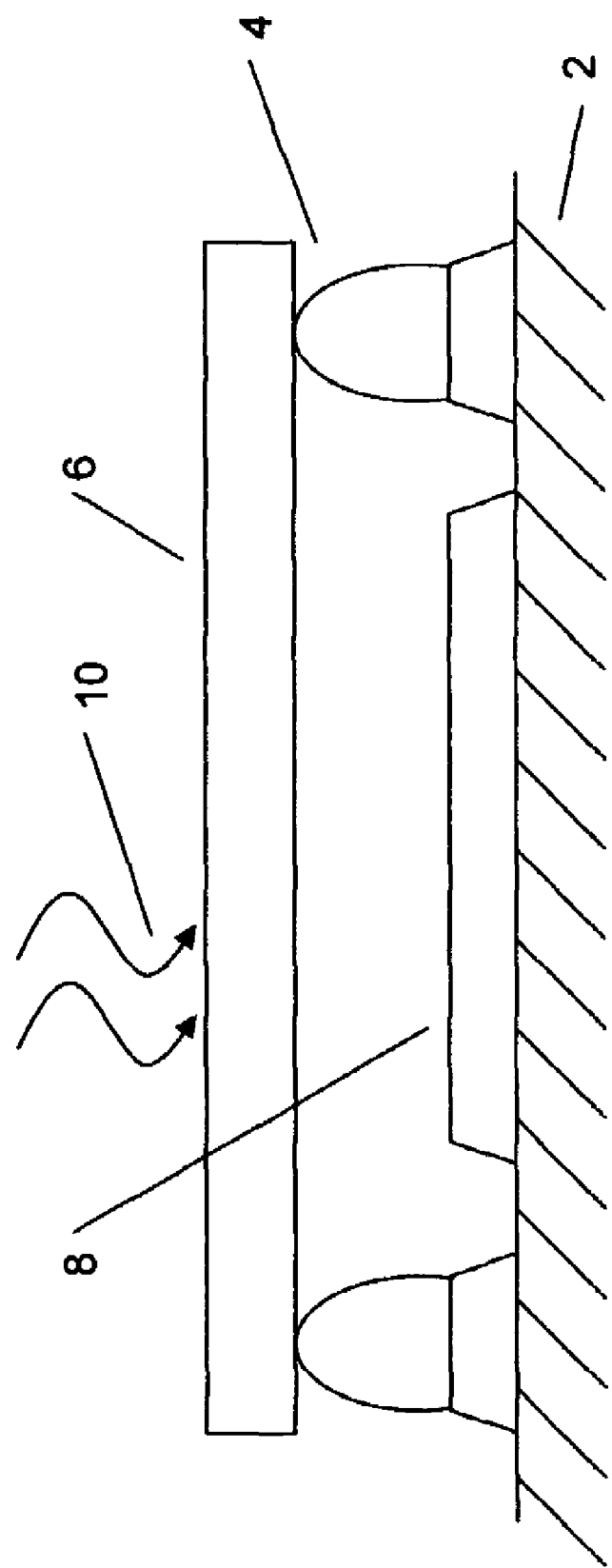

Not applicable.

BACKGROUND

1. Field of Invention

This invention relates to integrating a microphone into an integrated circuit made using standard processing.

2. Description of Prior Art

In systems using microphones, the means of converting the sound energy into electric energy involves some sort of material which flexes when the sound wave strikes, and then this flexing is converted into electrical energy.

In many electronic systems where size is very limited such as cell phones and hands-free telephones such as speakerphone® telephones, the microphone is a "condenser" microphone. The equivalent circuit of a condenser microphone is a capacitor, C, typically on the order of 0.15 uF, and a resistor, typically on the order of 3 kΩ, in series. A bias voltage, Vb, is applied, and charge, Q, is stored on the capacitance according to the well known definition of a capacitor, Q=C×Vb. The sound pressure causes the capacitor to change value, and the physics of this operation are well known to those skilled in the art. Since the capacitor value, C, changes, but the voltage, V, is fixed, the charge, Q, must change. Current is defined as the change in charge per unit time, so changing the sound pressure results in a current. This current is applied to a low noise amplifier capable of increasing the signal to a level appropriate for the application. Since the condenser microphone is a separate element from the rest of the electronics, its piece-part cost and assembly space and cost add to the system cost.

Hearing aids are another application requiring a sound-pressure to electrical transducer.

Numerous U.S. patents exist for various means of making the required small transducers. Many, however, relate to means which are not easily implemented in a single integrated circuit along with other electronics: U.S. Pat. Nos. 6,615,667, 6,473,511, 6,343,514, 6,324,907, 6,283,915, 6,249,075, 6,001,666, 5,881,159, and 5,740,258.

U.S. Pat. Nos. 4,610,062 and 4,922,471 involve using a silicon substrate. However, the first patent uses a sacrificial material with deposited film requiring wet integrated circuit processing and introducing materials that are potential ionic contaminants. It is therefore unacceptable for modern processing. The second patent actually requires two such substrates, with a membrane separation, and additional process steps for non-standard etching significantly increasing cost.

U.S. Pat. Nos. 7,146,016, 6,667,189 and 4,533,795 disclose inventions enabling the microphone to be incorporated directly into a standard integrated circuit process, however, they require considerable additional processing on the active surface as well as back etching. This additional processing is not available as part of any low cost integrated circuit manufacturing operation.

U.S. Pat. Nos. 6,426,239 and 6,156,585 also disclose inventions enabling the microphone to be incorporated directly into a standard integrated circuit process, however, they also require considerable additional processing for back etching.

None of the prior art describes means for using the techniques in differential structures, and such structures are essential for good quality noise performance when integrating analog signal processing circuits on integrated circuits containing the kinds of digital circuitry commonly found in modern electronic systems. Furthermore, unless a differential structure is used, placing active circuitry under the integrated microphone would result in intolerable degradation in performance.

SUMMARY

In accordance with one implementation of the present invention, well known and widely used solder bump technology is applied to the silicon chip. A thin piece of metallic material, for example copper, is attached to the solder bumps. This forms the one plate of a capacitor. A metal level or other conductive layer such as doped poly, doped silicon, or even the substrate material in the standard integrated circuit process is placed directly below the metallic plate. This forms the other plate of a capacitor. Sound energy causes the metallic plate to flex, and the net effect is a variable capacitance. A fixed bias voltage, Vb, is applied to the capacitance. As the capacitance, C, varies, so does the charge, Q, since capacitance and charge are related by Q=C×Vb. Changing charge, by definition, results in current. This current is then applied to a low noise amplifier.

Circuitry is integrated on the same chip to properly bias the capacitor and to convert the current into a voltage for further processing. Such processing, along with other system electronics, can be incorporated on the same silicon die.

An alternative arrangement is also disclosed, in which the die with one capacitor plate and solder bumps is attached to a standard lead frame or printed circuit board having appropriate metallization to form the other plate.

OBJECTS AND ADVANTAGES

Accordingly, several objects and advantages of this invention are:

(f) a microphone is made that is compatible with low cost integrated circuit processing;

(g) the microphone can be incorporated on the same silicon die as other elements in the system;

(h) parts count, assembly cost and size are reduced;

(i) by appropriate attention to layout, the integrated circuits associated with the rest of the application can be placed under the integrated microphone resulting in virtually no extra silicon area being needed for the integrated microphone;

(j) no new or non-standard steps in the manufacture of the silicon die are required; and (f) the microphone can be incorporated into a differential structure, such structures being essential for good quality noise performance when integrating analog signal processing circuits on integrated circuits containing the kinds of digital circuitry commonly found in modern electronic systems.

DRAWING FIGURES

1. FIG. 1 shows an edge view of the solder bump integrated microphone.

Figure 2:
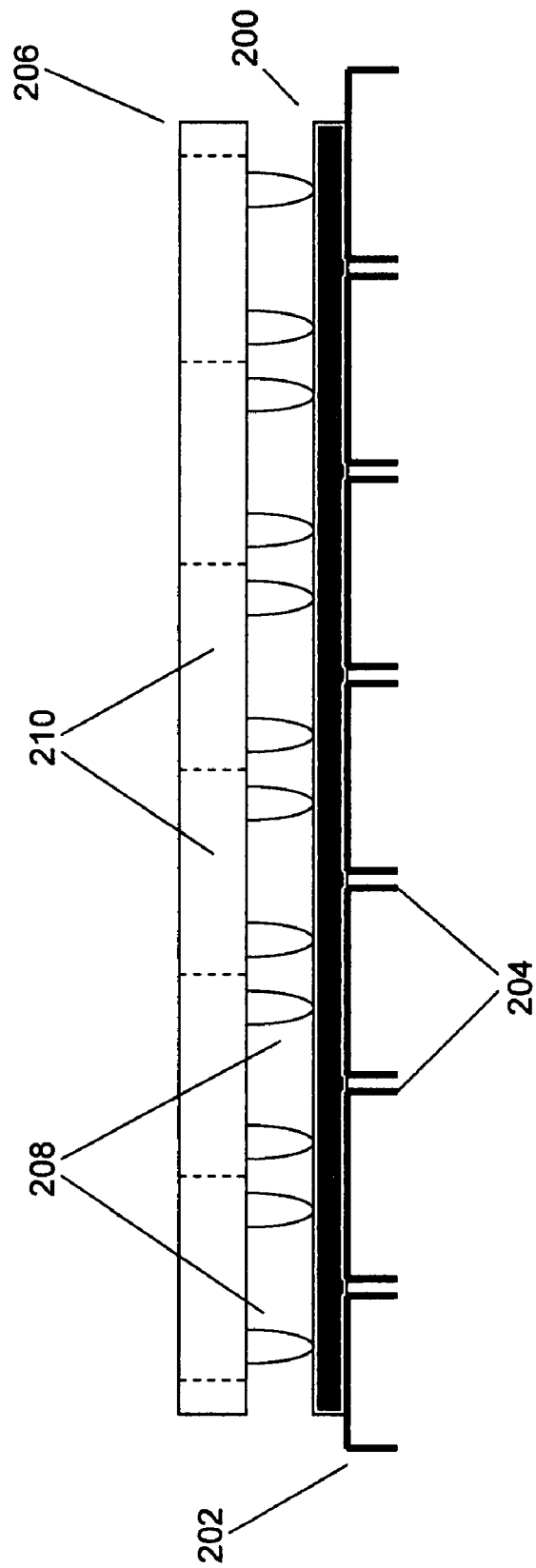

2. FIG. 2 shows a heated chuck holding the foil and the silicon wafer assembly arrangement.

Figure 3:
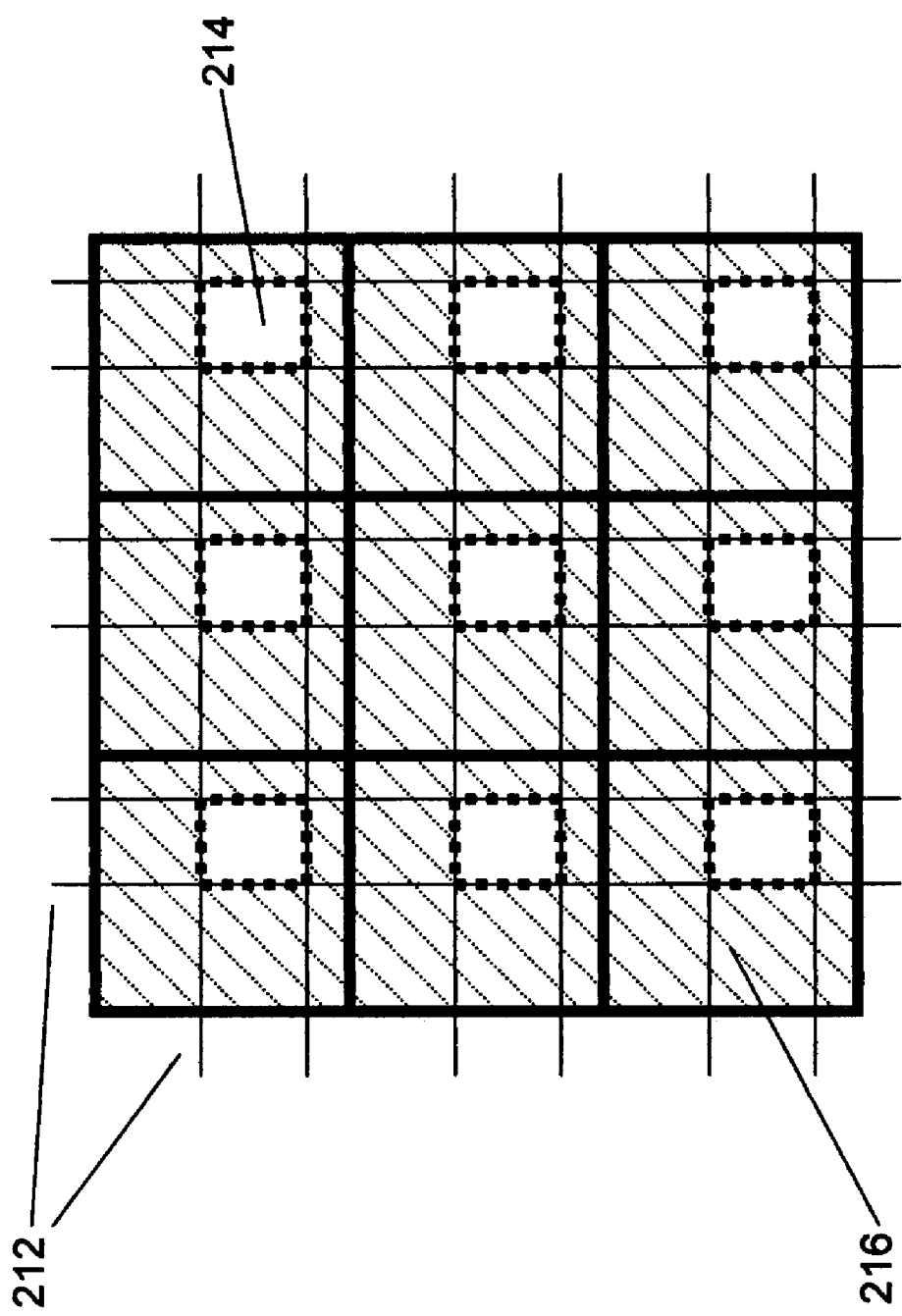

3. FIG. 3 shows the capacitor top plat laser scribe lines.

Figure 4:
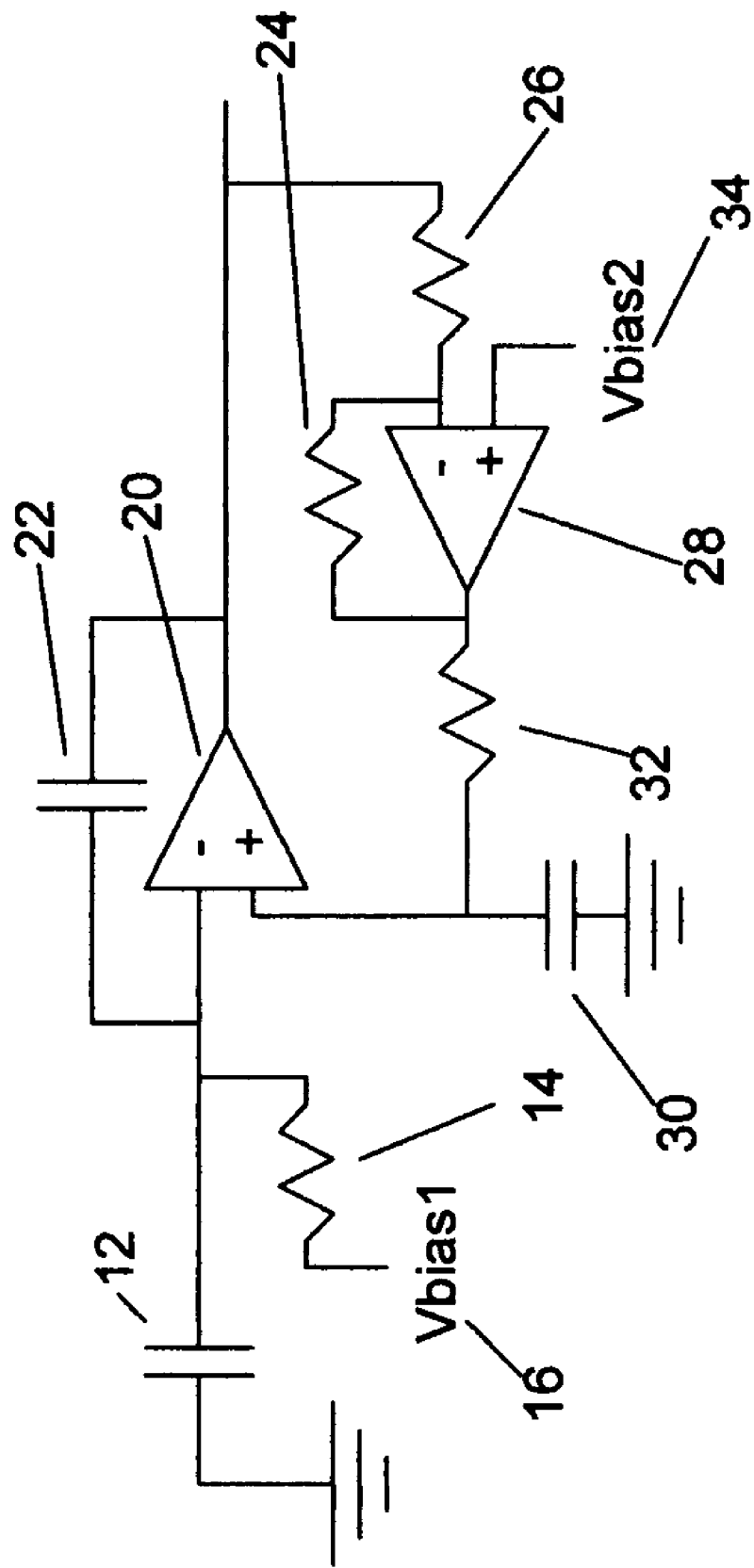

4. FIG. 4 shows the integrated microphone signal applied to a low noise amplifier.

Figure 5:
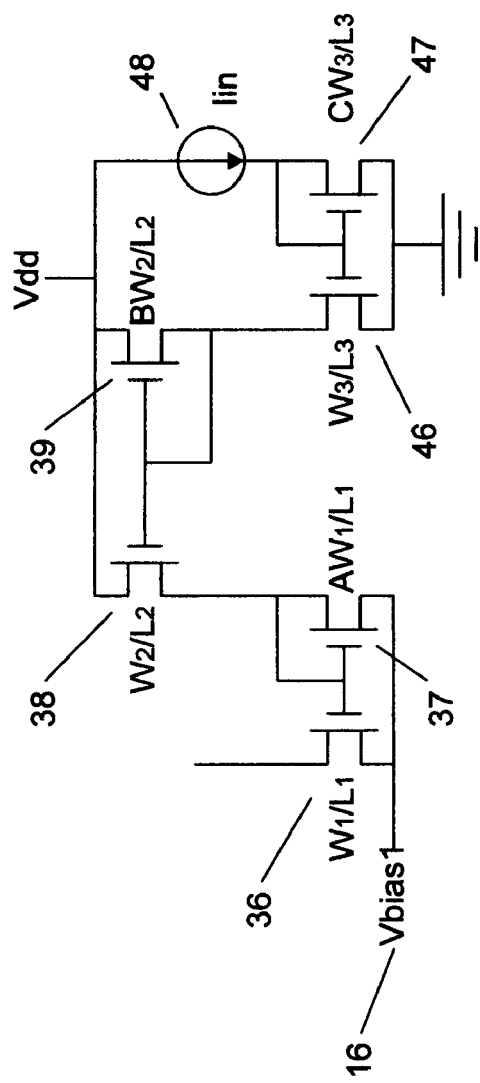

5. FIG. 5 shows one means of obtaining a very large value bias resistor.

Figure 6:
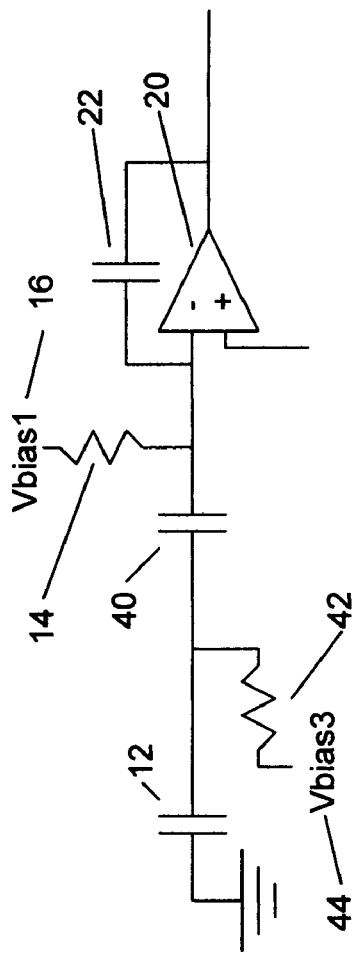

6. FIG. 6 shows the addition of components to allow larger bias voltage applied to the integrated microphone.

7. FIG. 7 shows an implementation of the blocking capacitor that does not increase the silicon die area.

Figure 8A:
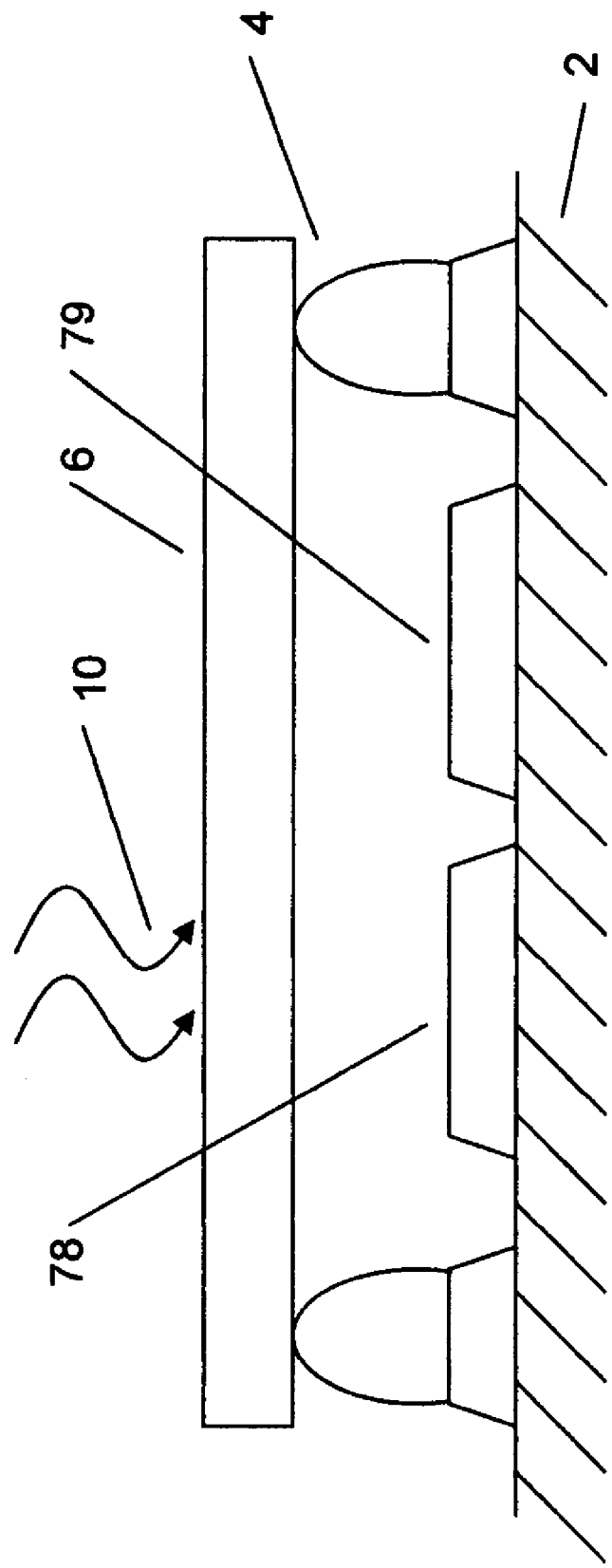
Figure 8B:
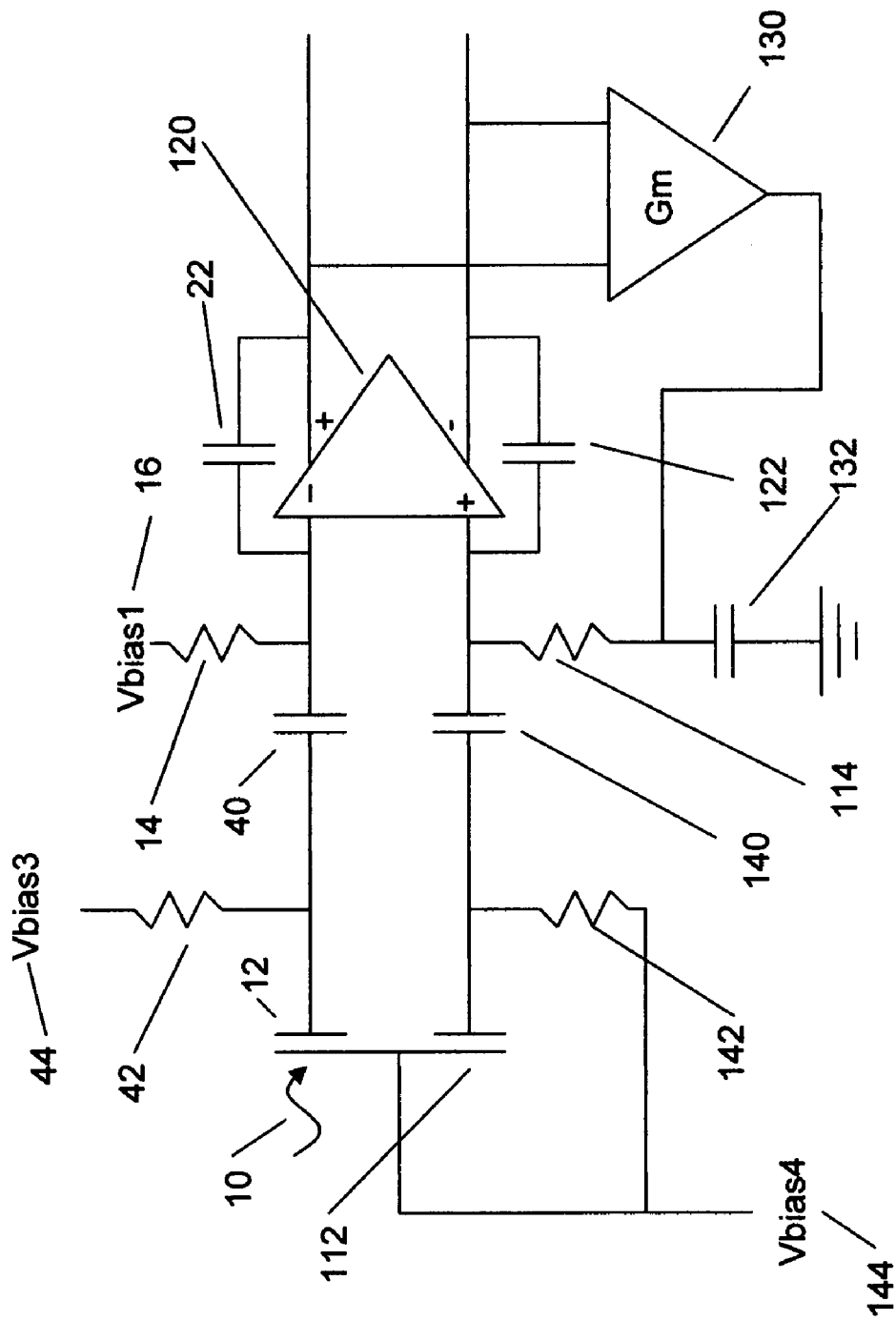

8. FIGS. 8A and 8B show an implementation of a differential integrated microphone and one associated circuit implementation.

Figure 9:
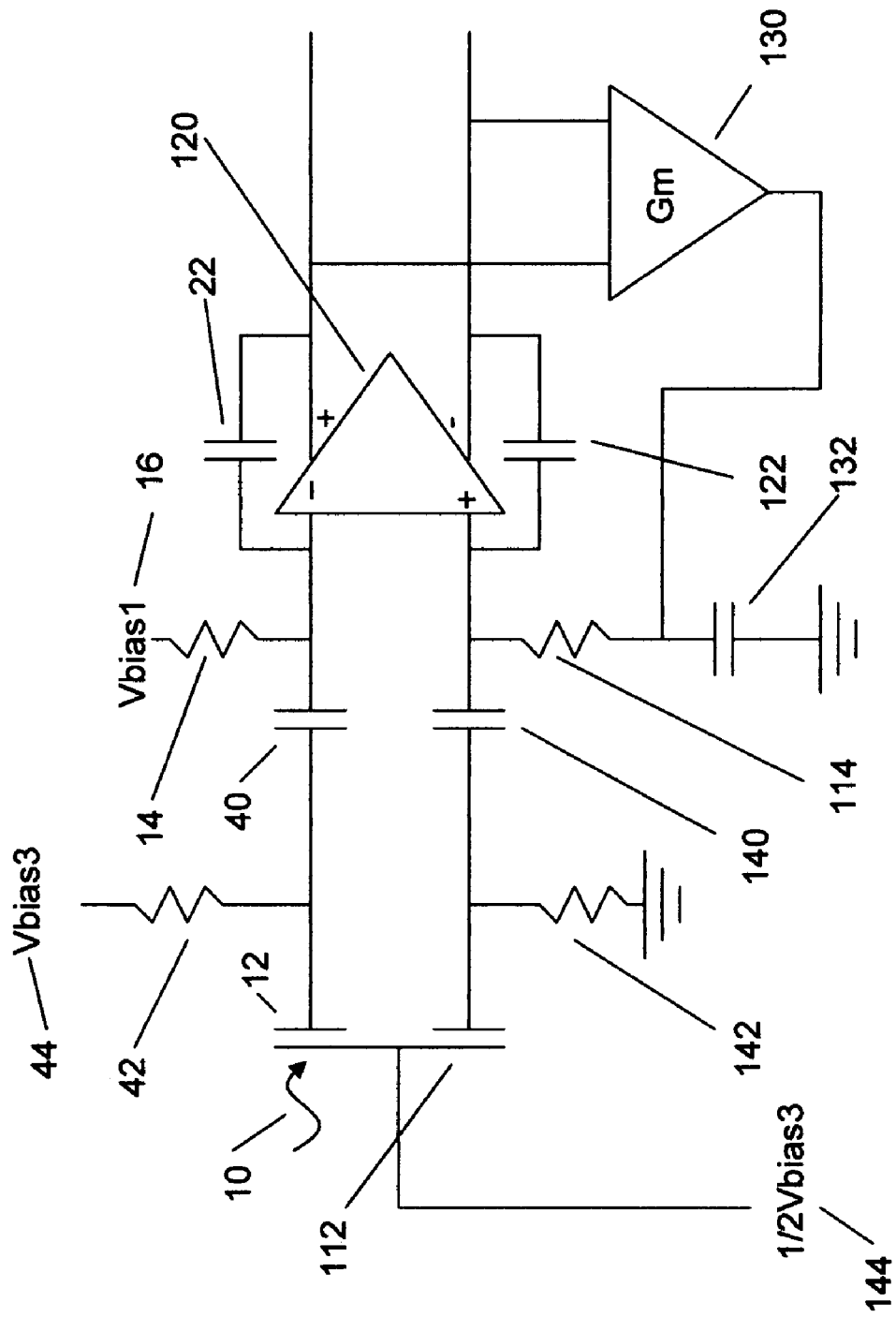

9. FIG. 9 shows a second differential circuit implementation.

Figure 10:
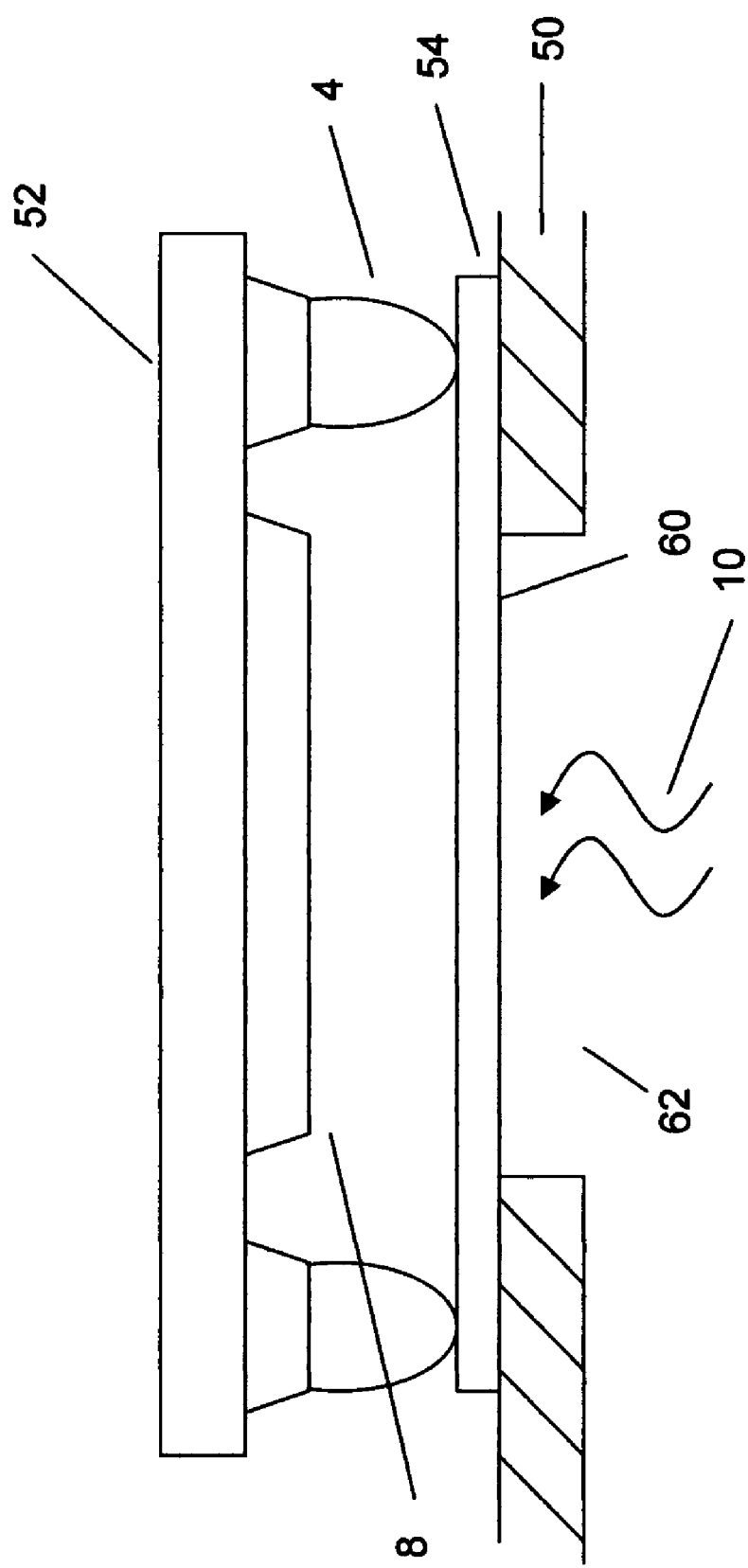

10. FIG. 10 shows an alternate integrated microphone structure.

DESCRIPTION

Preferred Embodiment

FIG. 1 shows an integrated circuit die 2 with solder bumps 4 and the top plate 6 and bottom plate 8 of a capacitor. Solder bumps as part of an integrated microphone were previously disclosed in U.S. Pat. No. 4,610,062. However, the structure in which they were used involved additional process steps and potentially damaging ionic materials making the overall structure not suitable for use with modern processing. In the preferred embodiment, the metallic plate would be used as the top plate 6. Copper is one example of a metallic material that is a flexible metal, and therefore can be readily deflected by sound waves 10. Copper also is compatible with standard solder bump technology. Those skilled in the art know that a numerous other materials can be used. Although this top metallic plate 6 is not part of any standard integrated circuit flow, it is applied after the addition of solder bumps 4, which is currently the last step in manufacturing solder bump wafers. This step would replace the normal bonding step when packaging a die with solder bumps. The die, which of course, contains all the electronics normally integrated in the system, would still need to be assembled onto a lead frame, and standard wire bond operations can still be used. The sequence of attachment to the lead frame and attachment of the metallic plate 6 will depend on the manufacture's determination of optimum process flow.

Below the top plate 6, a conductive level 8 has been deposited, and this is part of the normal integrated circuit processing. In the preferred embodiment, this conductive level would be the top most metal used by the process, and this is also the level upon which the solder bumps 4 are normally placed.

FIG. 1 shows the structure for one capacitor. However, integrated circuits are processed many such circuits at the same time on a wafer. In this invention the top plate of the capacitor is also processed at the wafer level. As shown in FIG. 2, the flexible foil 200 is held by a vacuum chuck 202 that can be heated. Such heatable vacuum chucks 202 are readily available for wafer testing and can be easily modified for this operation. They contain multiple vacuum holes 204 to ensure the foil is held flat. The wafer 206 is pressed against the foil 202, the vacuum chuck 204 is heated, and the solder bumps 208 soften sufficiently to bond the foil 200 to the bumps 208. There is now one foil 200 covering the entire wafer 206. Laser scribing can be used to separate the foil 200 on each die 210 from the rest of the foil.

FIG. 3 shows nine die of the wafer with the laser scribe lines 212 that separate each top plate 214 from the rest of the foil by laser scribing. Laser scribing is already used in conventional integrated circuit manufacturing to separate the wafers. It is important that laser energy be controlled so that underlying silicon is not damaged as the beam cuts through the foil 200. Furthermore, it is preferred that one or more grounded metal levels be placed underneath the laser scribe lines through the foil 212 as further protection. Excess foil 216 must be removed so that it does not interfere with later assembly operations. The excess foil 216 can be blow away by a puff of air. Those skilled in the art will immediately understand there are any number of means to supply the air. Those skilled in the art will recognize that the scribe lines need not run in complete lines across the wafer; the laser could be turned down in power or off except to cut out the top plates, and then the entire remaining foil could simply be peeled away rather than blow off.

Usually, solder bumps, which are typically 10-20μ, are spread uniformly across the entire die according to manufacturing spacing rules. The primary purpose of uniformly applying the bumps is to minimize stress and flex on the die. A secondary effect is that the total available number of inputs and outputs is maximized. In the embodiment show in FIG. 1, the solder bumps 4 are restricted to the edge of the region that will be used for this microphone because a large area is used as the top plate of the capacitor 6, and the intent is to allow rather than minimize flex in this region. Also, final assembly may be by wire bond, so I/O solder bumps may not be needed.

The capacitance formed between the metallic top plate 6 and the bottom plate 8 is $C = \varepsilon_0 k W L/d$ where $\varepsilon_0 = 8.85 \times 10^{-2}$ pF/cm is the permeability of free space, k is the dielectric constant of any material between the plates, W and L are the width and length of the capacitor, and d is the space between the plates controlled by the size of the solder bumps 4, typically 10-20μ. In the preferred embodiment, W and L are the dimensions of the bottom plate 8. Assuming k=1.5 for an air gap, W=5 mm, L=5 mm, and d=20μ, then C=16 pF.

When a sound wave 10 strikes the top plate 6, it will cause the top plate 6 to flex in accordance with the variation in pressure of the sound wave 10. This changes the distance, d, between the plates. If a fixed voltage is applied to the capacitor, then the change in d will correspond to a change in C. This produces in a change in Q, and changing Q per unit time is defined as current.

FIG. 4 shows one circuit in which this integrated microphone can be used. The integrated microphone capacitor 12 has one side grounded, directly or ac wise by a well filtered fixed potential. The grounded side can be either plate 8 or 10, and designers will choose based on various considerations of noise pickup from underlying layers and circuits, electromagnetic interference, etc. The other plate is biased via a very large resistor 14 and a voltage bias, Vbias1, 16. The biased side of the integrated microphone capacitor 12 is connected to the summing node of an amplifier 20. A capacitor 22 is placed between the output and summing node of the amplifier 20. Those skilled in the art know that capacitor 22 could be formed in the same way as capacitor 12 for matching.

Negative feedback is applied from the output of amplifier 20 to the positive input of amplifier 20 to properly bias the amplifier 20. In the preferred embodiment, this negative feedback is a second amplifier 28, operating at low gain and its output may be filtered to minimize its noise contribution. Low gain is achieved by resistor 24 being small compared to resistor 26, and filtering is obtained by the resistor 32 and capacitor 30 combination. A reference voltage, Vbias2, 34 is applied to the positive input of amplifier 28. Those skilled in the art will immediately recognize that this feedback will result in the output dc operating point of amplifier 20 to be equal to the reference voltage 34. Bias voltage Vbias2 34 (FIG. 4) and bias voltage Vbias1 16 can be the same voltage source or different sources, at the designer's choice. Those skilled in the art will recognize that other means, for example a transconductance cell, may be used as a differential input amplifier to obtain the negative feedback.

Those skilled in the art will recognize that it is important for the resistor 14 to be sufficiently large that its noise current, the square root of 4 kT(1/R)B, where k=1.4×10$^{-23}$ J/° K is Boltzman's constant, T is the temperature in degrees Kelvin, R is the value of the resistor, and B is the bandwidth, is sufficiently low that the capacitor 22 filters it sufficiently so that the resultant noise voltage, $v_n$, is below the minimum signal level at the output of amplifier 20 where $$v_n^2 = \int_{fmin}^{fmax}(4kT/R)(2\pi fC_{22})^{-2}df \approx (kT/\pi^2)(1/RC_{22}^2 f_{min}) \text{ for } f_{max} >> f_{min}$$

Those skilled in the art will also realize that the capacitor 22 is limited in size since the gain from the input signal to the output of amplifier 20 is the ratio of capacitor 12 to capacitor 22.

One means of obtaining a very large value resistor 14 is to use un-doped polysilicon. Although this is not a standard step in most modern integrated processes, it only requires one additional mask and no changes to the normal process flow.

Another method of obtaining a large value resistor 14 is to use well known switched capacitor techniques. This would require antialiasing circuitry, using additional die area, and a clock. Means of doing such a design are well known to those skilled in the art.

Yet another method of obtaining a large value resistor 14 is to use a long channel FET. Biasing it with a sub-threshold gate to source voltage reduces the required length. Those skilled in the art will immediately recognize that this can easily be done by various circuit means, one of which is a cascade of current mirrors, as shown in FIG. 5. The applied current source Iin 48 is reduced by current mirror pairs 47, 48 and 38, 39 such that the current applied to transistor 37 is Iin/(B×C). Iin 48 and the current mirror coefficients B and C may be chosen so that transistor 37 may be biased in its sub-threshold region. Transistor 36 operates with essentially zero dc current. That is, it is in the linear mode of operation and it is essentially a resistor. By choice of the W1/L1 ratio of transistor 36 and the mirror ratio A of transistor 37, the resistance of transistor 36 can be made very large, and this is the bias resistor 14. Those skilled in the art will realize that attention must be paid to the various Ws and Ls and to matching to ensure that non-resistive noise, including 1/f noise and substrate effects of the current mirror transistors, do not degrade performance.

Other means of obtaining a large value resistor may be apparent to those skilled in the art, but these do not affect or in any way limit the scope of the invention of the integrated microphone.

FIG. 6 shows a change to the circuit that allows a larger bias voltage, Vbias3, 44 to be applied to the integrated microphone capacitor 12. This change is the addition of blocking capacitor 40. The higher bias voltage, Vbias3, 44 increases the stored change on capacitor 12 and therefore increases the signal current since the stored charge will change by the same percentage for a fixed change in capacitor dimension d. In the circuits of both FIGS. 4 and 6, the bias voltage 16 cannot exceed the maximum input common mode voltage of amplifier 20, and this maximum voltage is limited by the technology and the design of the amplifier 20. Noise constraints typically require that the input stage to amplifier 20 be very simple, so the maximum common mode voltage on this amplifier would be in the 2-3V range for a modern VLSI process. By adding blocking capacitor 40, dc bias to the summing node of amplifier 20 blocked from the integrated microphone capacitor 12, so an additional very large resistor 42 and a bias voltage, Vbias3, 44 are added.

Those skilled in the art will recognize that insertion of the blocking capacitor 40 and increasing the bias voltage Vbias1 16 may limit the options of implementing the large value resistor 14. For example, the current mirror method of FIG. 5 and the switched capacitor method are limited by various breakdown voltages of the integrated circuit processing.

Those skilled in the art will recognize that the blocking capacitor 40 must block the voltage from Vbias3 44, and, therefore, capacitor 40 must have a sufficiently high breakdown voltage. Typical capacitors in modern processes are in the range of 400-500 Å and a specified to sustain less than 6-7V. However, a capacitor can be made using two levels of metal, separated by 6000-7000 Å, and this will sustain far more voltage. Modern integrated circuit processes often have many metal levels, and the design may choose other ones to further increase the breakdown voltage. Although the capacitance density of such a capacitor is correspondingly lower than the thinner oxide capacitor, the thickness is still much less than the 10-20 separation of the plates of the integrated microphone. Therefore, capacitor 40 can be made much larger in value than capacitor 12, which is desirable to minimize attenuation, while using much less area. FIG. 7 shows one means of constructing the blocking capacitor 40. By placing capacitor 40 directly below the integrated microphone capacitor, the bottom plate 8 of the integrated microphone is also one plate of the blocking capacitor 40. A lower level of metallization or other conductive material 46 which are standard in the integrated circuit processing, is then used for the other plate of blocking capacitor 40. Other means of obtaining the dc operating point of amplifier 20 will also be evident. Such alternate arrangements do not affect the basic invention of the integrated microphone.

Although the FIG. 6 embodiment of the circuitry to which the integrated microphone 12 is connected uses single ended structures, those skilled in the art will immediately recognize the importance of incorporating into fully differential structures. Such structures are commonly used in analog integrated circuits having stringent noise requirements because they reject various forms of noise, especially from power supplies and coupling from other parts of the system through the integrated circuit substrate. One such structure for the differential capacitor is shown in FIG. 8A and its use in a circuit is shown in FIG. 8B.

In FIG. 8A, sound energy 10 causes the flexible top electrode 6 to move as in FIG. 1, and the top plate is supported and electrically connected by solder bumps 4, as before. However, the differential capacitor structure has two lower electrodes 78,79 on top of the substrate 2. While it is possible to reverse the electrodes so that the split side is the side impacted by the sound energy, as was discussed for the single ended structure, two upper electrode plates would need to be attached rather than one. This will increase manufacturing cost so is not the preferred embodiment.

In FIG. 8B, a balanced amplifier 120, which typically would have internal common mode feedback, replaces the single ended amplifier 22. Feedback for dc is supplied by transconductance amplifier 130 and associated large value resistor 114 along with capacitor 132 filter the ac signal. The integrated microphone is now composed of two capacitors, 12 and 112. Capacitor 12 is biased from voltage source Vbias3 44 feeding through large value resistor 42 as in the single ended designs, and capacitor 112 and large value resistor 142 are added to form a differential microphone structure. An additional blocking capacitor 140 and feedback capacitor 122 are applied to balanced amplifier 120 to complete the differential structure. Component matching is maintained throughout: 12, 112; 42, 142; 40, 140; 14, 114; 22, 122. However, resistor 142 is connected to a voltage source Vbias4 144, and those skilled in the art will immediately recognize that capacitor 112 is biased at 0V, while capacitor 12 is biased at Vbias3 44 minus Vbias4 144, and typically Vbias4 would be set 0V, i.e., ground. Since there is no dc bias on capacitor 112, there is no charge stored on it, and therefore any change to its plate separation, 'd,' will not result in a change in charge. Thus there is no signal current from capacitor 112. Those skilled in the art will immediately recognize that if capacitor 112 is biased at a non-zero voltage that is much less than voltage biasing capacitor 12, the properties are almost unchanged.

Those skilled in the art will recognize an alternative connection of the capacitor 112, FIG. 9. The electrodes of capacitor 112 could be reversed, and then the common plate of the microphone capacitors could be biased at Vbias4=½Vbias3, ac grounded to protect against pickup of electromagnetic interference. With this arrangement, if the resistor 142 is then connected to ground, a full differential signal is applied to the system, adding 6 dB of gain. However, maintaining equal parasitic elements—a key to maintaining good balance and good rejection of noise—becomes much more difficult.

In another possible implementation, shown in FIG. 10, the die 52 is attached upside down to the printed wiring board 50 via solder bumps. In this case, the bottom plate is now formed as a conductive layer 54 on the printed wiring board 50, and additional solder bumps, not shown, are used on the die for I/Os. Sound energy 10 passes through the opening 62 to deflect the electrode 60. Although attaching the flexible electrode 60 is not generally part of a standard printed wiring board process, those skilled in the art will recognize that its addition is not complex, difficult, or expensive.

One could envision an embodiment of FIG. 10 in which sound waves 10 strike the back side of the silicon die 52, causing the silicon die 52 to deflect. The advantage of this structure is that a standard protection coating can be applied to the chip. The disadvantage is that the die 52 is more rigid than the metallic plate 6, so for a given sound wave 10 and a given bias voltage, Vbias1 16, the signal is lower and the noise requirements on all aspects of the design are more difficult. Thinning of wafers after processing is common for assembly in thin quad (TQ) type industrial standard packages, and this same thinning could be applied to decrease the rigidity of the silicon. However, the silicon die would still be substantially more rigid that in the arrangement of FIG. 10, and the design would be markedly more difficult.

Those skilled in the art will realize that there is no fundamental restriction against placing circuitry underneath the integrated microphone capacitor in the silicon die when a metal level is used for the plate 46 on the silicon. The only limitation is that such circuitry may only use metal levels below those used for the bottom plate 8 or the plate 46 of the blocking capacitor 40, if such blocking capacitor 40 is constructed as shown in FIG. 7.

Although the integrated microphone described here is especially suited to applications such as cell phones, hearing aids, or other hands free telephone, it is applicable to virtually any other application in which microphones are currently used.

Although the descriptions given here for the circuitry related to biasing and buffering the integrated microphone are CMOS structures, the integrated microphone can also be used in bipolar, BiCMOS, or other integrated circuit processes.

Although capacitor plate deflections will typically be small, maximizing defection is important since this maximizes change in charge and therefore increases signal to noise ratio. Depending on the material used for the top plate in the FIG. 1 embodiment, and depending on what encapsulation might be used around the microphone, trapped air between the plates may need pressure relief (such relief is commonly found in speakers). Obviously, if there is no sidewall encapsulation, then pressure relief is via the open sidewalls. However, if sidewalls are enclosed, pressure could inhibit plate deflection and reduce the signal strength, and if this effect were non-linear, it would also produce distortion. In such a situation, a few small holes could be placed in the plate that is not part of the silicon for pressure relief.

Although this invention uses solder bump technology, as technology evolves, other means of obtaining a separation between the silicon plate and the other plate may be developed. If such means (laser spot welding may be one possible method) are lower in cost than solder bumps, then they can replace the solder bumps. Such means could be compatible with either the integrated circuit process flow or with the printed wiring board process flow. For example, material could be placed on the printed wiring board and etched away where the integrated microphone is shown in FIG. 7. Then the die is attached to that printed circuit material, the thickness of which would define the capacitor plate separation, d.

ADVANTAGES

From the description above, a number of advantages of this method of designing microphones become evident:
(f) a microphone is made that is compatible with integrated circuit processing;
(g) the microphone can be incorporated on the same silicon die as other elements in the system;
(h) parts count, assembly cost and size are reduced;
(i) by appropriate attention to layout, the integrated circuits associated with the rest of the application can be placed under the integrated microphone resulting in virtually no extra silicon area being needed for the integrated microphone;
(j) no new or non-standard steps in the manufacture of the silicon die are required; and
(f) the microphone can be incorporated into a differential structure, such structures being essential for good quality noise performance when integrating analog signal processing circuits on integrated circuits containing the kinds of digital circuitry commonly found in modern electronic systems.

CONCLUSIONS, RAMIFICATIONS, AND SCOPE

Accordingly, it is evident that this invention offers a means of integrating a microphone on the same silicon die as other parts of the system, with almost no added manufacturing cost and with almost no additional die area since active circuitry can be placed under the microphone. The result is reduced part count, reduced assembly cost, and reduced size.

We claim:

1. An electronic circuit comprised of:
   a capacitor having a first electrode formed using a conductive layer of a silicon integrated circuit and a second electrode formed from a flexible conductive metallic foil,
   solder bumps technology on the integrated circuit wafer used to fabricate said silicon integrated circuit,
   said second electrode attached to said solder bumps,
   said foil during assembly being held firmly by means of a hot vacuum chuck and said solder bumped wafer pressed against it so that all the integrated circuits on said wafer receive said microphone circuit at the same time,
   said foil then attached to said solder bumps by solder reflow via heating through the means used to hold the foil,
   said foil on each integrated circuit separated from the rest of the foil by means of laser scribing after said attachment is made,
   any residual said foil being easily blow away from the wafer by any low pressure air flow,
   a charge stored on said capacitor,
   whereby sound energy striking said second electrode deflects said second electrode causing a change in the value of said capacitor causing a change in charge which is signal current.

2. An electronic circuit variable capacitor comprised of:
   a stationary first electrode and a deflectable second electrode,
   said first electrode formed using a conductive layer of a silicon integrated circuit and said second electrode formed from a flexible conductive metallic foil,
   solder bumps technology on the integrated circuit wafer used to fabricate said silicon integrated circuit,
   said second electrode attached to said solder bumps,
   said foil during assembly being held firmly by means of a hot vacuum chuck and said solder bumped wafer pressed against it so that all the integrated circuits on said wafer receive said microphone circuit at the same time,
   said foil then attached to said solder bumps by solder reflow via heating through the means used to hold the foil,
   said foil on each integrated circuit separated from the rest of the foil by means of laser scribing after said attachment is made,
   any residual said foil being easily blow away from the wafer by any low pressure air flow,
   a charge stored on said capacitor,
   either said first electrode or said second electrode connected to the signal reference potential, the said other electrode connected a first bias voltage source by a first large value resistor, that said other electrode also connected to the summing node of a first differential input amplifier,
   an integrating capacitor connected between said summing node and the output of said first differential input amplifier,
   negative feedback from said output of said amplifier to the positive input of said first differential input amplifier,
   whereby said signal current is converted to a voltage at the output of said first differential input amplifier,
   and whereby the dc operating point of said first differential input amplifier is controlled by said negative feedback.

3. An electronic circuit of claim 2 comprised of:
   said negative feedback obtained by a second differential input amplifier,
   said second amplifier having feedback to stabilize it,
   said second amplifier having a second bias voltage applied to its positive input,
   whereby said second bias voltage becomes the dc operating point at the output of said first differential input amplifier.

4. An electronic circuit of claim 2 comprised of:
   a blocking capacitor added between said summing node and the circuitry comprising said first bias voltage source, said first large value resistor and said first or second electrode connected to said summing node,
   a second large value resistor connected from said summing node of said first differential input amplifier to a third bias voltage,
   whereby the summing node of said first differential input amplifier is biased at the voltage of said third reference potential.

5. An electronic circuit comprised of two capacitors of the form of claim 2,
   said second electrodes of both said capacitors connected to a common node made from a flexible conductive material,
   said first electrodes of both said capacitors forming a differential output,
   said first capacitor being biased at a first voltage and said second capacitor being biased at a second voltage much lower than said first voltage, zero volts being one possible value of said second voltage,
   wherein sound energy applied to first electrode of both said capacitors produces a current from said first capacitor and little or no current from said second capacitor,
   and wherein common mode electrical noise and signal applied to the two said capacitors produces essentially a zero differential signal at said differential output thereby allowing use of the silicon under said capacitors for active silicon circuitry.

6. An electronic circuit comprised of two capacitors of the form of claim 2,
   said second electrodes of both said capacitors connected to a common node made from a flexible conductive material,
   said first electrodes of both said capacitors forming a differential output,
   said first capacitor being biased at a first voltage and said second capacitor being biased at a second voltage of equal magnitude but opposite sign of first voltage,
   wherein sound energy applied to first electrode of both said capacitors produces a differential current from said second differential output.

* * * * *